United States Patent
McCleary

(10) Patent No.: US 8,547,699 B1
(45) Date of Patent: Oct. 1, 2013

(54) ENCLOSURE FOR OUTSIDE PLANT EQUIPMENT WITH INTERCONNECT FOR MATING PRINTED CIRCUIT BOARDS, PRINTED CIRCUIT BOARD DEVICE AND METHOD OF REPAIRING OUTSIDE PLANT EQUIPMENT

(75) Inventor: Jacob D. McCleary, Harvest, AL (US)

(73) Assignee: Adtran, Inc., Huntsville, AL (US)

( * ) Notice: Subject to any disclaimer, the term of this patent is extended or adjusted under 35 U.S.C. 154(b) by 226 days.

(21) Appl. No.: 12/942,048

(22) Filed: Nov. 9, 2010

(51) Int. Cl.
H05K 7/20 (2006.01)

(52) U.S. Cl.
USPC .......... 361/721; 361/704; 361/709; 361/711; 361/736; 361/789; 165/80.3; 165/104.33; 165/185; 439/65; 439/75

(58) Field of Classification Search
USPC .............. 361/679.46, 679.54, 704–711, 714, 361/715, 719–724; 165/80.2, 80.3, 104.33, 165/104.34, 185; 174/252, 547, 548, 50, 174/70 S, 47, 16 HS; 312/223.2, 223.3, 236; 379/441, 442, 451, 454; 439/134, 46, 66, 439/69, 91, 74, 82, 295, 426, 320, 933, 851; 29/830, 832, 842, 864, 845, 874
See application file for complete search history.

(56) References Cited

U.S. PATENT DOCUMENTS

| | | | | | |
|---|---|---|---|---|---|
| 4,482,937 | A | * | 11/1984 | Berg ............................ | 361/789 |
| 4,572,604 | A | | 2/1986 | Ammon et al. ................ | 339/176 |
| 4,901,203 | A | | 2/1990 | Kobayashi et al. | |
| 4,963,966 | A | * | 10/1990 | Harney et al. ................ | 725/149 |
| 5,065,278 | A | * | 11/1991 | Schultz ......................... | 361/688 |
| 5,157,588 | A | * | 10/1992 | Kim et al. ..................... | 361/736 |
| 5,194,947 | A | * | 3/1993 | Lowcock et al. ............. | 725/149 |
| 5,251,099 | A | * | 10/1993 | Goss et al. .................... | 361/721 |
| 5,267,122 | A | * | 11/1993 | Glover et al. ................. | 361/704 |
| 5,295,044 | A | * | 3/1994 | Araki et al. ................... | 361/709 |
| 5,323,454 | A | * | 6/1994 | Shay et al. .................... | 379/327 |
| 5,381,314 | A | * | 1/1995 | Rudy et al. .................... | 361/712 |
| 5,646,828 | A | | 7/1997 | Degani et al. | |
| 5,675,300 | A | * | 10/1997 | Romerein ..................... | 333/100 |
| 5,734,776 | A | * | 3/1998 | Puetz ............................ | 385/134 |
| 5,740,527 | A | | 4/1998 | Mitama | |
| 5,763,830 | A | * | 6/1998 | Hsueh ............................. | 174/60 |
| 5,842,874 | A | | 12/1998 | Yagi et al. ...................... | 439/74 |
| 5,886,296 | A | * | 3/1999 | Ghorbani et al. .............. | 174/50 |
| 5,907,474 | A | | 5/1999 | Dolbear ....................... | 361/705 |

(Continued)

OTHER PUBLICATIONS

Final Office Action in U.S. Appl. No. 12/942,054, issued on Dec. 3, 2012, 17 pages.

*Primary Examiner* — Michail V Datskovskiy
(74) *Attorney, Agent, or Firm* — Fish & Richardson P.C.

(57) ABSTRACT

An enclosure for outside plant equipment includes a base unit and first Printed Circuit Board (PCB) carried by the base unit and having a circuit side and opposing component side on which electronic components are mounted. A heat sink is connected to the first PCB at the circuit side and configured to dissipate heat from any electronic components mounted on the first PCB at the component side. A cover is attached to the base unit and has an inside surface covering the enclosure. A second PCB has a circuit side and opposing component side on which electronic components are mounted. The second PCB is supported by the inside surface of the cover. A heat sink is connected to the second circuit board at the circuit side and configured to dissipate heat from any electronic components mounted on the second PCB. A PCB finger connector interconnects the first and second PCB's at the component side.

32 Claims, 14 Drawing Sheets

(56) References Cited

U.S. PATENT DOCUMENTS

| | | |
|---|---|---|
| 5,986,887 A | 11/1999 | Smith et al. |
| 6,065,530 A * | 5/2000 | Austin et al. ............... 165/80.3 |
| 6,116,925 A | 9/2000 | Tung ............................ 439/101 |
| 6,135,786 A | 10/2000 | Johnson et al. ............ 439/76.1 |
| 6,312,263 B1 | 11/2001 | Higuchi et al. ............... 439/66 |
| 6,320,748 B1 | 11/2001 | Roden et al. ................. 361/704 |
| 6,349,033 B1 | 2/2002 | Dubin et al. ................. 361/704 |
| 6,386,889 B1 | 5/2002 | Bishop ........................... 439/66 |
| 6,402,540 B1 | 6/2002 | Kuhmel et al. ............... 439/378 |
| 6,556,811 B1 * | 4/2003 | Sayers et al. ................ 455/90.3 |
| 6,798,878 B2 * | 9/2004 | Laetsch ......................... 379/338 |
| 6,870,106 B1 * | 3/2005 | Schiffbauer et al. ........ 174/74 R |
| 6,882,536 B2 | 4/2005 | Deeney et al. ................ 361/719 |
| 6,932,618 B1 * | 8/2005 | Nelson ........................... 439/66 |
| 7,042,734 B2 | 5/2006 | Hensley et al. |
| 7,050,305 B2 | 5/2006 | Thorum |
| 7,086,870 B1 * | 8/2006 | Sutcliffe ......................... 439/75 |
| 7,160,117 B2 | 1/2007 | Ngo .............................. 439/76.1 |
| 7,260,301 B2 * | 8/2007 | Barth et al. .................. 385/135 |
| 7,352,945 B2 * | 4/2008 | Holmberg et al. ........... 385/135 |
| 7,417,861 B2 | 8/2008 | Kikuchi et al. |
| 7,491,884 B2 * | 2/2009 | Schmidt et al. ................ 174/60 |
| 7,535,716 B2 * | 5/2009 | Fischer et al. ................ 361/714 |
| 7,574,093 B2 * | 8/2009 | Holmberg et al. ........... 385/135 |
| 7,729,131 B2 | 6/2010 | Wang et al. |
| 7,734,040 B1 * | 6/2010 | Ayres et al. .................. 379/451 |
| 7,778,033 B2 * | 8/2010 | Kretman ...................... 361/703 |
| 7,855,891 B1 * | 12/2010 | Ayres et al. .................. 361/711 |
| 7,915,544 B1 * | 3/2011 | Ayres et al. .................. 174/564 |
| 8,039,764 B2 | 10/2011 | Yang |
| 8,247,708 B1 * | 8/2012 | Ayres et al. .................. 174/564 |
| 8,289,692 B2 | 10/2012 | Franz et al. |
| 2002/0008963 A1 | 1/2002 | DiBene et al. |
| 2002/0030973 A1 | 3/2002 | Scafidi |
| 2002/0141159 A1 * | 10/2002 | Bloemen ...................... 361/704 |
| 2004/0037044 A1 | 2/2004 | Cook et al. ................... 361/719 |
| 2005/0122691 A1 | 6/2005 | Crippen et al. |
| 2005/0237721 A1 * | 10/2005 | Cowley et al. ............... 361/727 |
| 2006/0067054 A1 | 3/2006 | Wang |
| 2008/0013296 A1 | 1/2008 | Chen et al. |
| 2008/0080142 A1 | 4/2008 | Chen et al. |
| 2008/0266777 A1 | 10/2008 | Goldstein et al. |
| 2009/0027857 A1 | 1/2009 | Dean et al. |
| 2009/0146283 A1 * | 6/2009 | Chen et al. ................... 257/686 |

* cited by examiner

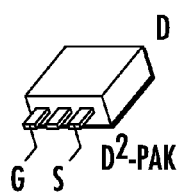
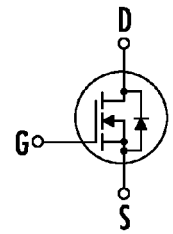

MOSFET MAXIMUM RATINGS $T_C$ = 25°C UNLESS OTHERWISE NOTED*

| SYMBOL | PARAMETER | | RATINGS | UNITS |
|---|---|---|---|---|
| $V_{DSS}$ | DRAIN TO SOURCE VOLTAGE | | 300 | V |
| $V_{GSS}$ | GATE TO SOURCE VOLTAGE | | ±30 | V |
| $I_D$ | DRAIN CURRENT | -CONTINUOUS ($T_C$=25°C) | 28 | A |
| | | -CONTINUOUS ($T_C$=100°C) | 19 | |
| $I_{DM}$ | DRAIN CURRENT | -PULSED | 112 | A |
| $E_{AS}$ | SINGLE PULSED AVALANCHE ENERGY | | 588 | mJ |
| $I_{AR}$ | AVALANCHE CURRENT | | 28 | A |
| $E_{AR}$ | REPETITIVE AVALANCHE ENERGY | | 25 | mJ |
| dv/dt | PEAK DIODE RECOVERY dv/dt | | 4.5 | V/ns |
| $P_D$ | POWER DISSIPATION | ($T_C$=25°C) | 250 | W |
| | | -DERATE ABOVE 25°C | 2.0 | W/°C |
| $T_J$, $T_{STG}$ | OPERATING AND STORAGE TEMPERATURE RANGE | | -55 TO +150 | °C |
| $T_L$ | MAXIMUM LEAD TEMPERATURE FOR SOLDERING PURPOSE, 1/8" FROM CASE FOR 5 SECONDS | | 300 | °C |

THERMAL CHARACTERISTICS

| SYMBOL | PARAMETER | RATINGS | UNITS |
|---|---|---|---|
| $R_{\theta JC}$ | THERMAL RESISTANCE, JUNCTION TO CASE | 0.5 | °C/W |
| $R_{\theta JA}$* | THERMAL RESISTANCE, JUNCTION TO AMBIENT* | 40 | |
| $R_{\theta JA}$ | THERMAL RESISTANCE, JUNCTION TO AMBIENT | 62.5 | |

*WHEN MOUNTED ON THE MINIMUM PAD SIZE RECOMMENDED (PCB MOUNT)

FIG. 10

ENCLOSURE FOR OUTSIDE PLANT EQUIPMENT WITH INTERCONNECT FOR MATING PRINTED CIRCUIT BOARDS, PRINTED CIRCUIT BOARD DEVICE AND METHOD OF REPAIRING OUTSIDE PLANT EQUIPMENT

FIELD OF THE INVENTION

This invention relates to enclosures for outside plant equipment, heat sinks used with printed circuit boards for such outside plant equipment, and method of repairing same.

BACKGROUND OF THE INVENTION

Electronics are typically cooled from the top of the component with an interface, for example, a Thermal Interface Material (TIM) located between the top of the component that is secured on a Printed Circuit Board (PCB) and a heat sink, such as a conventional heat sink plate. This type of structure is used in many conventional devices, including many telecommunications Outside Plant (OSP) Equipment enclosures. This type of construction has several drawbacks, especially when used with an OSP Digital Subscriber Line Access Multiplexer (DSLAM) enclosure. If the unit requires testing or trouble-shooting, the PCB must be removed from the enclosure forming the heat sink in order to access electronic components. If the heat sink is removed from the component on the PCB for troubleshooting, there is a possibility of damage to the integrated circuit mounted to the PCB from overheating, because of lack of a heat sink. Some components have very high heat fluxes which require that they be heat sunk at all times, even at room temperature.

Also, some surface mount components do not sit flush on the PCB, due to component float during the solder reflow process. There are also thickness tolerances of each integrated circuit package. This requires the use of thick and soft thermal interface pads, especially when using a common heat sink to cool multiple integrated circuits. For example, extremely compliant and thick thermal interface pads are used between the integrated circuits and the heat sink plate to account for the large tolerance stack up that can be generated. This is accomplished to ensure that the components are always in contact with the thermal pad(s), but not overcompressed/damaged by forces imparted by the heat sink plate to the integrated circuit(s), or to other components that may be located within the thermal pad area. Also, the cost of the thermal interface material is a function of both thermal conductivity and hardness, as well as, sheer volume of the material used. The higher thermal conductivity material is typically more expensive than lower conductivity material. The softer material is typically more expensive than the harder material. Additionally, it is difficult to generate accurate thermal images of components when the heat sink is mounted to the component side of the PCB, and thus, positioned over the component.

There is also an issue with such construction because it is difficult to interconnect PCB's together. The heat sink covers the components on the component side, making interconnection difficult. Thus, an issue arises of how to connect multiple PCB's together in an outside plant equipment enclosure.

SUMMARY OF THE INVENTION

An enclosure for outside plant equipment includes a base unit and first Printed Circuit Board (PCB) carried by the base unit and having a circuit side and opposing component side on which electronic components are mounted. A heat sink is connected to the first PCB at the circuit side and configured to dissipate heat from any electronic components mounted on the first PCB at the component side. A cover is attached to the base unit and has an inside surface covering the enclosure. A second PCB has a circuit side and opposing component side on which electronic components are mounted. The second PCB is supported by the inside surface of the cover. A heat sink is connected to the second circuit board at the circuit side and configured to dissipate heat from any electronic components mounted on the second PCB. A PCB finger connector interconnects the first and second PCB's at the component side.

In one example, the PCB finger connector is formed as a gold-finger PCB connector. A socket is formed on the component side of each of the first and second PCB's and configured to receive an edge of the PCB finger connector and make a blind-mated connection. The heat sink is connected to the first PCB and mounted within the base unit and secured thereto and the first PCB is secured at the circuit side to the heat sink. The heat sink is connected to the second PCB and mounted to the cover and the second PCB is secured at the circuit side to the heat sink.

In another example, the PCB comprises vias and thick plane sections to transfer heat from electronic components mounted on the component side to the circuit side into the heat sink. The PCB is formed as a plurality of planar configured metallic layers in another example and configured to spread and transfer heat from any electronic components mounted on the component side through the PCB into the heat sink. A Thermal Interface Material (TIM) is applied to the circuit side of each PCB and secured to respective heat sinks. A plurality of TIM strips are connected to each heat sink and respective PCB. Each heat sink comprises riser sections to which the plurality of TIM strips are connected. The TIM strips can be arranged in substantially parallel rows and formed as an adhesive material in an example.

A printed circuit board device is also enclosed in which a first PCB has a circuit side and opposing component side on which electronic components are mounted. A heat sink is connected to the first PCB at the circuit side and configured to dissipate heat from any electronic components mounted on the first PCB at the component side. A second PCB has a circuit side and opposing component side on which electronic components are mounted. A heat sink is connected to the second circuit board and configured to dissipate heat from any electronic components mounted on the second PCB at the component side. A PCB finger connector interconnects the first and second PCB's at the component side.

A method of repairing outside plant equipment is also disclosed.

BRIEF DESCRIPTION OF THE DRAWINGS

Other objects, features and advantages of the present invention will become apparent from the detailed description of the invention which follows, when considered in light of the accompanying drawings in which:

FIG. 10 is a chart showing an example of a representative component that has a low thermal resistance to the PCB in accordance with a non-limiting example.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
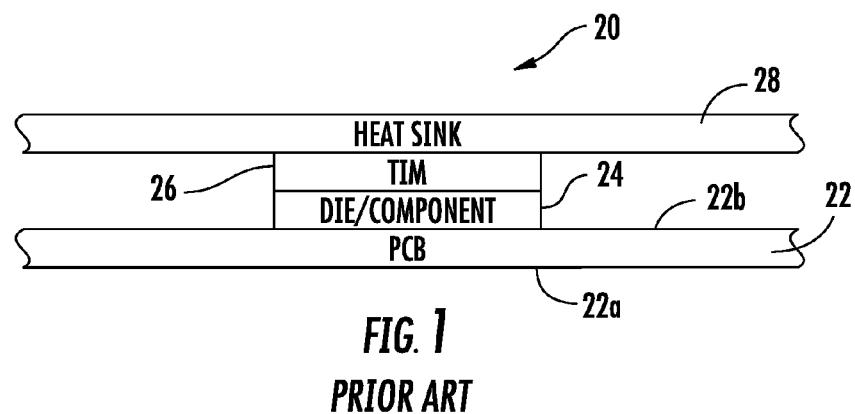
FIG. 1 is a fragmentary sectional view of a prior art PCB and heat sink assembly in which the heat sink is mounted over the semiconductor die/component and a Thermal Interface Material (TIM) is positioned between the heat sink and PCB.

FIG. 1 is a prior art example of a heat sink device 20 showing a Printed Circuit Board (PCB) 22 having a circuit side 22a and component side 22b. A semiconductor die or other electronic component 24 is mounted on the component side opposite the circuit side. This is a typical configuration and includes a Thermal Interface Material (TIM) 26 connected on top of the electronic component 24 and a heat sink 28, such as a heat sink plate, secured to the TIM and over the electronic component to allow heat transfer from the electronic component through the TIM and into the heat sink. FIG. 1 prior art is a typical example such as used in many different types of electronic devices, including a modular outside plant equipment, for example, a Digital Subscriber Line Access Multiplexer (DSLAM) enclosure.

This type of heat sink device construction shown in FIG. 1 has several drawbacks, especially when used with an outside plant (OSP) equipment DSLAM enclosure. If the unit requires testing, the PCB 22 must be removed from the chassis in order to access the electronic components. If the PCB 22 and the electronic component 24 are removed from the heat sink 28 for troubleshooting, there is a possibility of damage to the electronic component or other integrated circuit from overheating because of the lack of a heat sink. Some components dissipate several watts of heat and must be heat sunk at all times even at room temperature.

Also, some surface mount components have component float because of the manufacturing tolerances associated with the thickness of the electronic component or other integrated circuit. In the type of arrangement such as shown in FIG. 1, extremely compliant and thick thermal interface pads are used between the electronic component 24 and the heat sink 28 to account for the large tolerance stack up that can be generated. This is accomplished to ensure that the electronic component is always in contact with the TIM, but not over-compressed or damaged by forces imparted by the heat sink to the electronic component. Also, the cost of the TIM is a function of its thermal conductivity (the higher thermal conductivity is more expensive), its softness/compliance (the softer is more expensive), and its thickness (the thicker is more expensive). Additionally, it is difficult to generate accurate thermal images or components when the heat sink is mounted to the component side of the PCB, and thus, positioned at the top of the PCB 22 over the electronic component.

Figure 2:
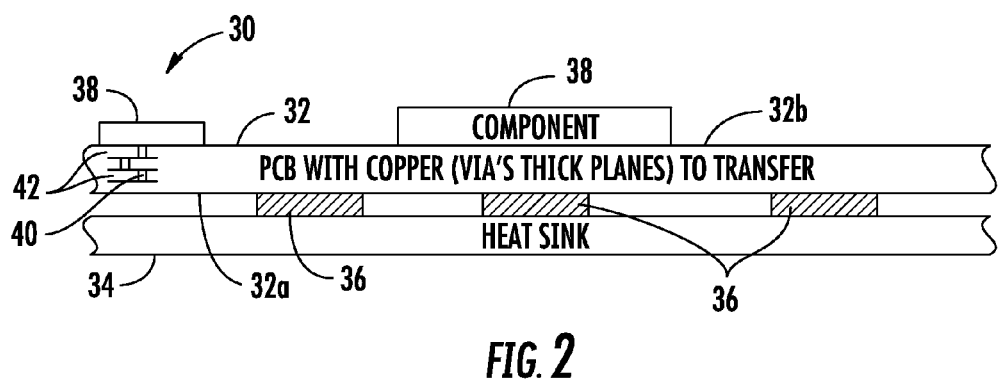
FIG. 2 is a fragmentary sectional view of a heat sink device that includes a PCB and heat sink in accordance with a non-limiting example in which the heat sink is carried by the circuit side of the PCB opposite any semiconductor die/component that is mounted on the component side of the PCB.

FIG. 2 is an example of a heat sink device 30 in accordance with a non-limiting example that solves the technical problem associated with the prior art heat sink device shown in FIG. 1. In the device 30 of FIG. 2, a PCB 32 has a circuit side 32a and opposing component side 32b to which components are mounted. The PCB is secured at the circuit side to the heat sink 34 such as through the thermal interface material (TIM) 36. The electronic component 38 is mounted to the component side 32b as illustrated. The PCB 32 further comprises conductive vias 40 and thick plane sections 42 such as formed of large copper areas shown in fragmentary section to transfer heat from electronic components 38 secured on the component side 32b to the circuit side 32a and into the heat sink 34 through the thermal interface material 36 that is applied to the circuit side of the PCB and secured to the heat sink 34 as shown in this non-limiting example.

Typically, the electronic components are chosen with a low internal thermal resistance to the PCB for integrated circuit packaging and use large copper areas on the thick planes with the conductive vias 40 to transfer heat from the bottom of the electronic component to the circuit side of the PCB. Because the thermal interface material 36 and heat sink 39 no longer have to be configured to deal with tolerance stack up of the component and the manufacturing processes, the thermal interface material can be thinner than would be necessary otherwise. Additionally, the thinner thermal interface material can be made to have a harder and/or less compliant formulation because the mounting interface tolerance stack up is removed. This also allows direct access to the components for troubleshooting without having to remove the PCB from its heat sink. This also reduces the possibility of damage to an electronic component that might require a heat sink 34. This type of heat sink device 30 as illustrated also allows for thermal imaging of the component side of the PCB since the heat sink no longer blocks the view.

Figure 3:
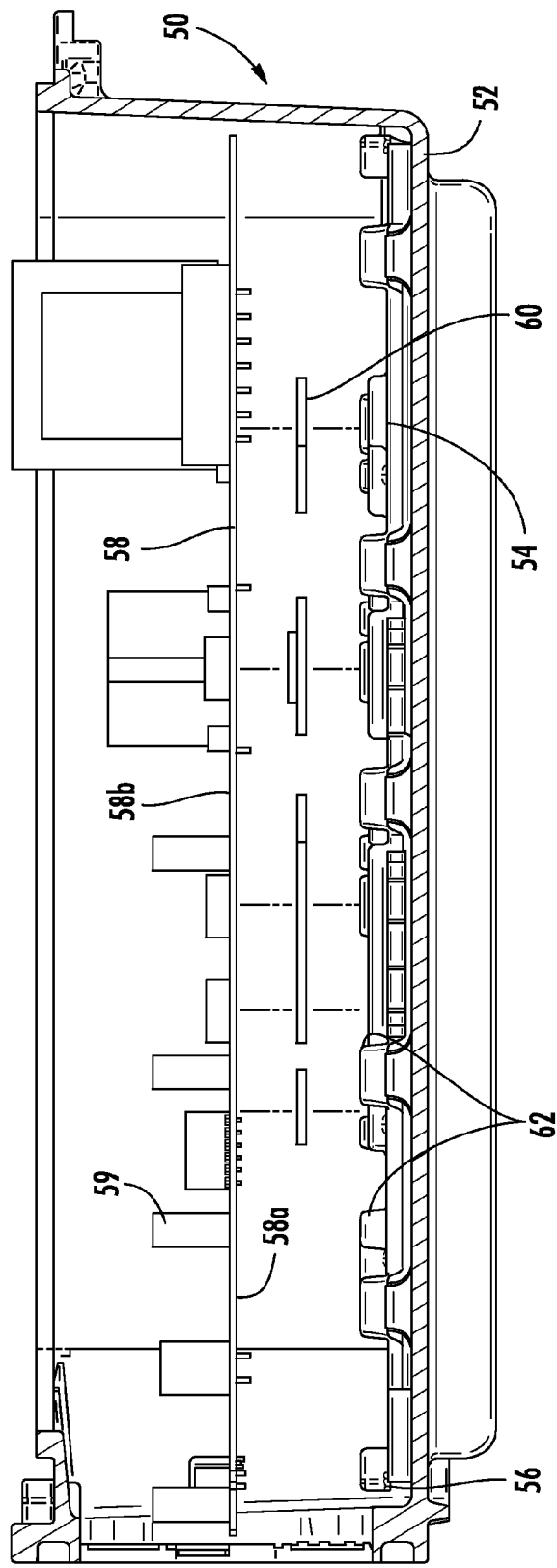
FIG. 3 is a sectional view of an enclosure for outside plant equipment in accordance with a non-limiting example and showing the PCB that mounts to the heat sink and connected to the base unit on the circuit side and electronic components mounted on the component side of the PCB opposite the circuit side.

FIG. 3 is a sectional view of a portion of an enclosure 50 for outside plant (OSP) equipment and showing the base unit 52 forming part of the enclosure with the cover removed. A heat sink 54 is mounted within the base unit 52 and secured thereto at the bottom section or floor 56. It is possible that the entire bottom section 56 of the base unit could be the heat sink in a non-limiting example. The PCB 58 is shown removed from the heat sink 54 for purposes of showing the circuit side 58a and opposing component side 58b on which electronic components 59 are mounted. The PCB 58 will be secured at the circuit side 58a to the heat sink 54 mounted within the base unit 52. The TIM strips 60 will be applied to the circuit side of the PCB and secured to the heat sink at riser sections 62 as illustrated. In FIG. 3, the TIM strips 60 are shown removed from both the circuit side and riser sections of the heat sink.

In this particular example, the enclosure 50 could be for an OSP DSLAM such as an OSP LPU or TA1124 or TA1148 as non-limiting examples. These listed enclosures are manufactured by ADTRAN, INC. of Huntsville, Ala.

Figure 4:
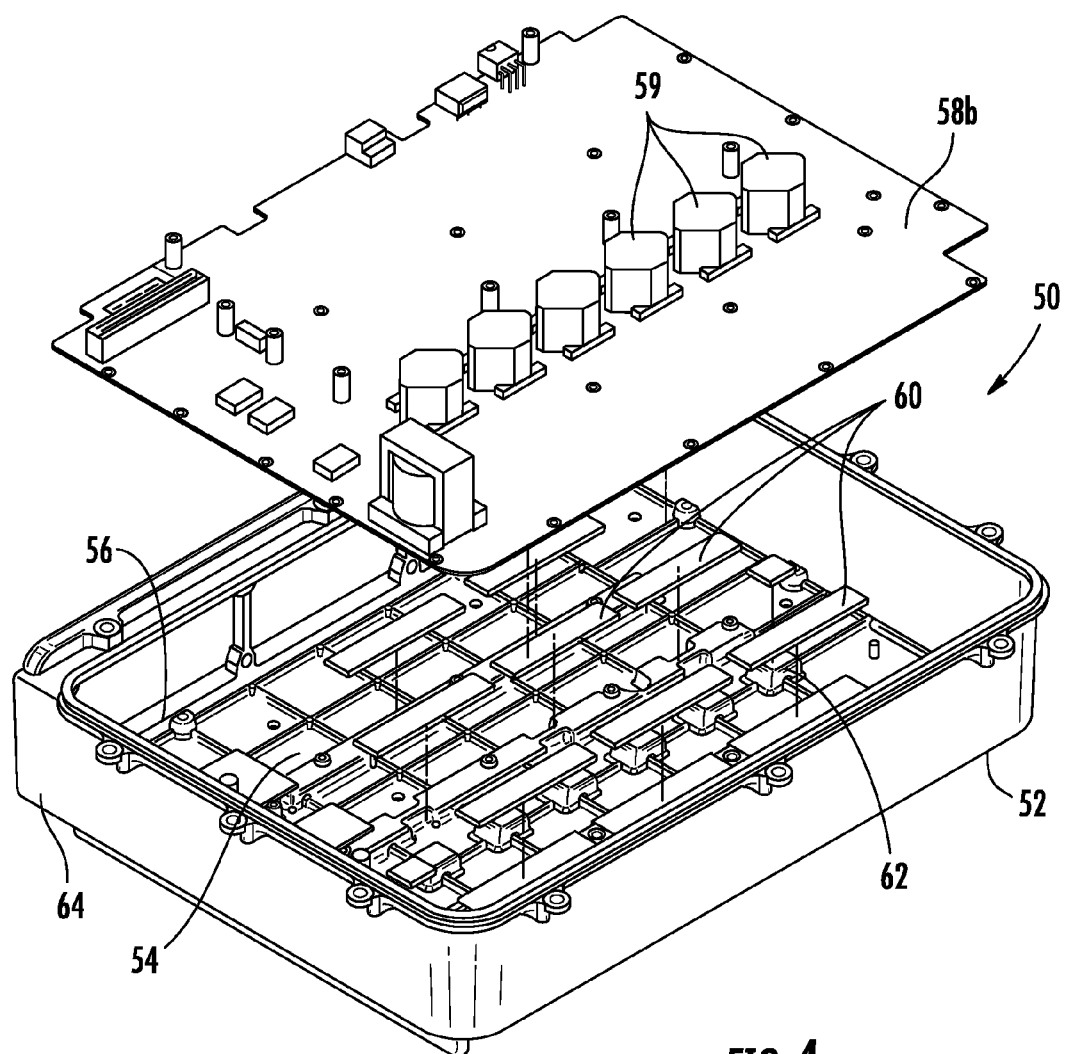
FIG. 4 is an exploded isometric view of the base unit of the enclosure shown in FIG. 3 and showing a plurality of TIM strips mounted onto risers of the heat sink and connected to the base unit.

FIG. 4 is an exploded isometric view showing greater details of the base unit 52 and showing how it is configured as a rectangular configured enclosure having the bottom section 56 and side walls 64. The enclosure includes the heat sink with riser sections 62 as described before to which a plurality of TIM strips are connected as illustrated. TIM strips 60 are arranged in substantially parallel rows with the parallel formed riser sections 62 in this non-limiting example. In one example, a TIM 60 comprises an adhesive material to permit the PCB to be secured to the heat sink in an efficient manner and allow relative easy removal of the PCB from the heat sink if necessary during repair. Electronic components 59 are illustrated on the PCB 58.

Figure 5:
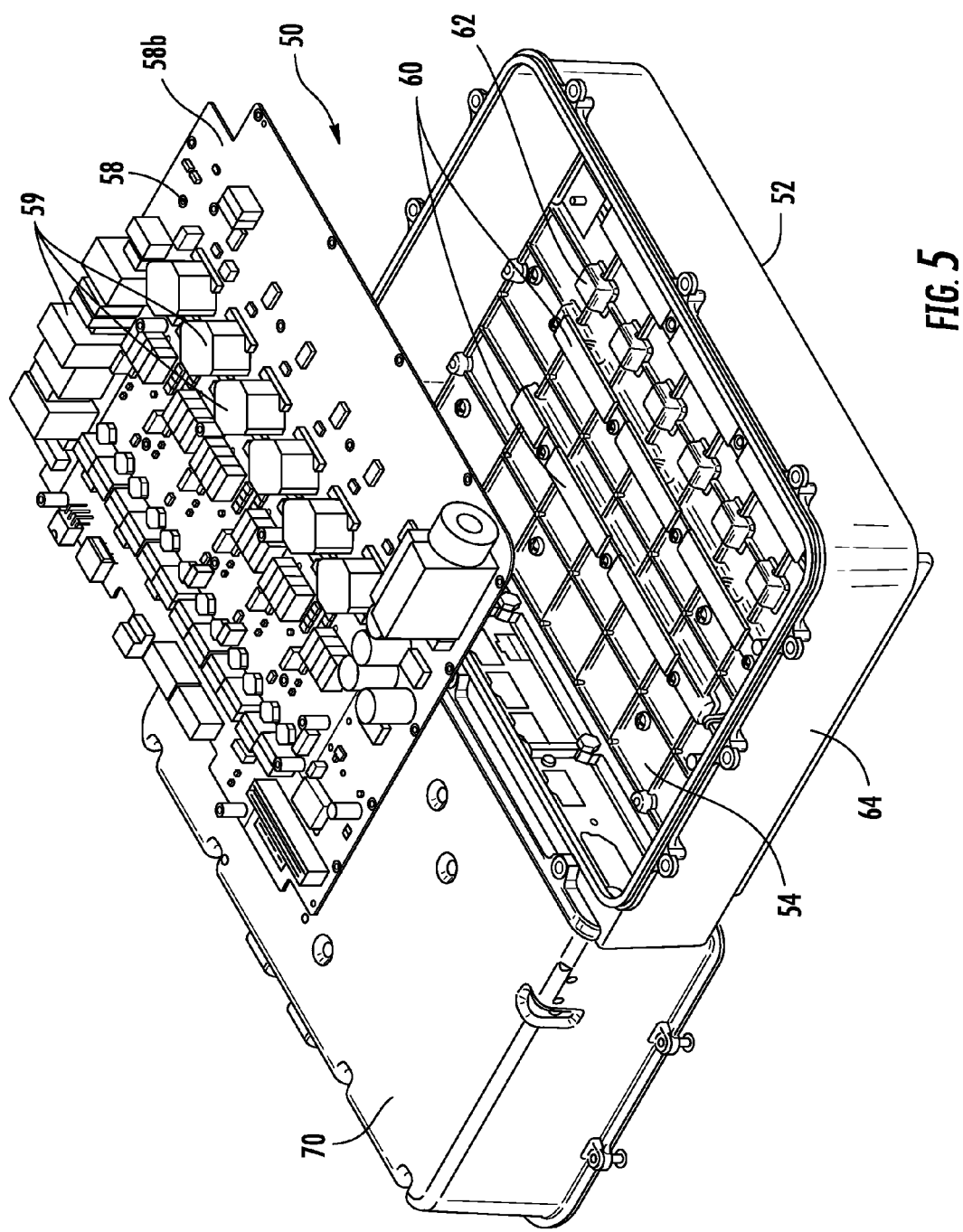
FIG. 5 is another exploded isometric view similar to FIG. 4 and showing the PCB with other components mounted thereon and also showing a secondary enclosure.

FIG. 5 is another exploded isometric view of the enclosure 50 and showing the base unit 52 with the cover removed and showing a secondary enclosure 70 that could include other PCB's and electronic components for other functions for the outside plant (OSP) equipment. The PCB 58 as illustrated includes a greater number of electronic components as illustrated.

Figure 6:
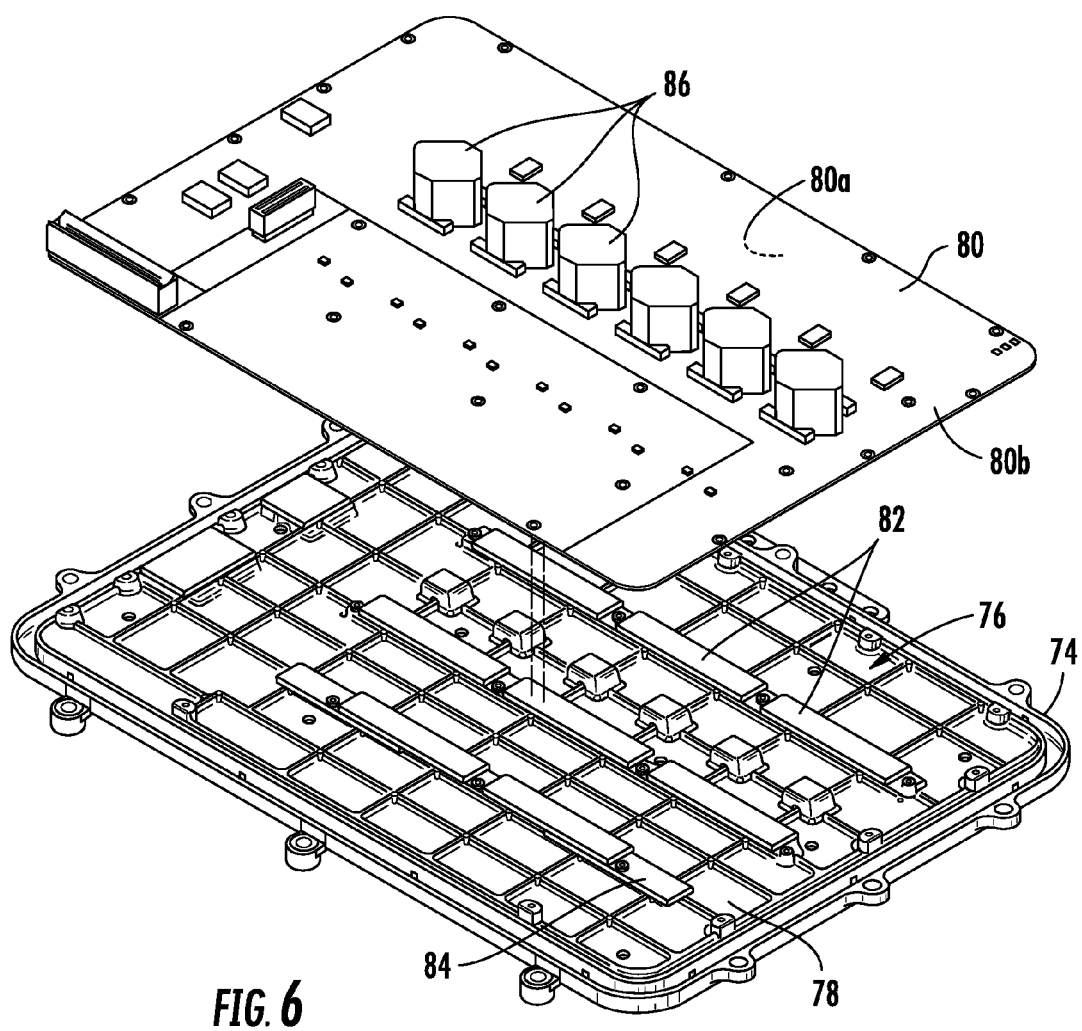
FIG. 6 is an exploded isometric view showing the cover and associated heat sink and a plurality of TIM strips that interface with a PCB mounted thereon.

FIG. 6 is an exploded isometric view of a cover 74 that attaches to the base unit 52 and has an inside surface 76 that covers the formed enclosure 50. In this example, a heat sink 78 is carried by the cover 74, but could be formed integral with the cover 74 depending on design. A PCB 80 has a circuit side 80a and opposing component side 80b to which electronic components 86 are mounted and secured at the circuit side to the heat sink 78 carried by the cover 74. A plurality of TIM strips 82 are applied to the riser sections 84 on the heat sink 78. In this particular example, the TIM strips are applied first to the riser sections, and afterward, the PCB is secured and retained thereto. The TIM strips can be formed as an adhesive material, such that the adhesive TIM strips are applied. The PCB engages the cover and is attached and secured by the TIM strips in this example. Electronic components 86 are illustrated.

Figure 7:
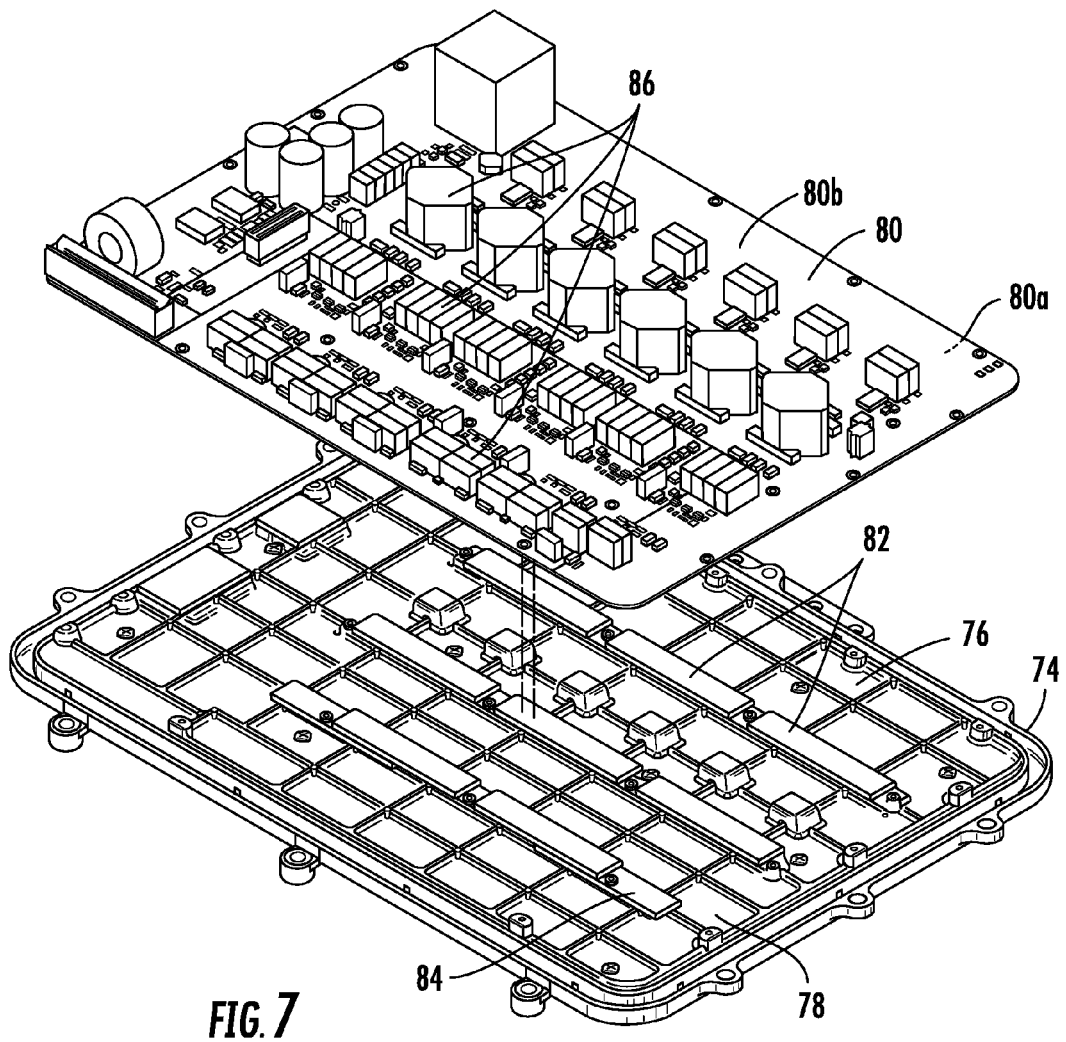
FIG. 7 is another exploded isometric view of the cover similar to that shown in FIG. 6, but showing more electronic components mounted on the cover.

FIG. 7 is another exploded isometric view of the cover 74 and PCB similar to that shown in FIG. 6, but showing a greater number of electronic components 86 mounted on the PCB.

Figure 8:
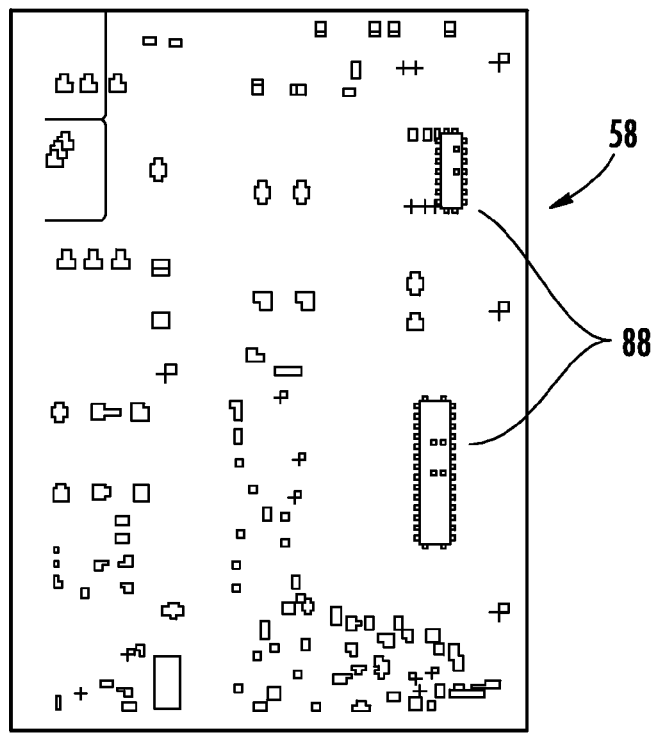
FIG. 8 is an example of a printed circuit board (PCB) construction and showing a drill plan with via holes for components that are coupled to the heat sink opposite the component side.
Figure 8A:
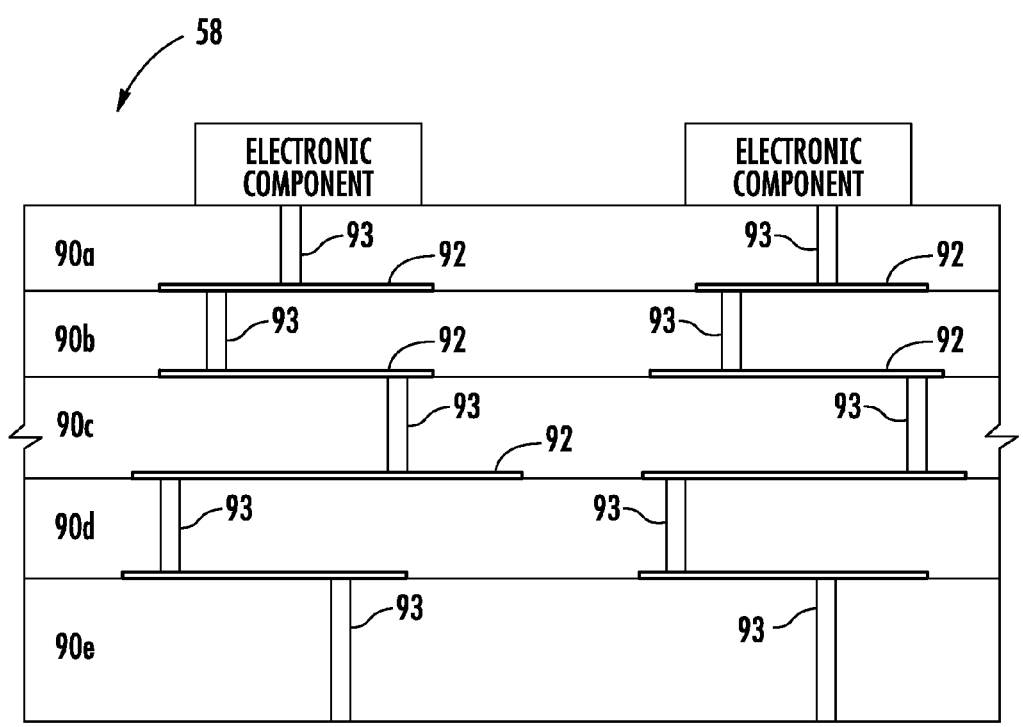
FIG. 8a is a fragmentary, sectional view of the PCB showing multiple layers and connecting vias that are used to increase the conduction through the PCB.

As noted before, the PCB 32, 58, 80 in each example illustrated in FIGS. 2-7, includes conductive vias 40 and thick plane sections 42 to transfer heat from electronics secured on the component side to the circuit side of the heat sink. FIG. 8 is a plan view of a PCB such as at 58 and showing via drill locations 88 for three components that are coupled to a heat sink in the indicated component locations. In this particular example as noted before, the PCB further comprises conductive vias 40 and thick plane sections 42 to transfer heat from electronic components secured on the component side to the circuit side and into a heat sink. FIG. 8A shows a representative PCB 58 with five layers 90a-e, each having large copper areas 92 for transferring heat and conductive vias 93.

Figure 9:
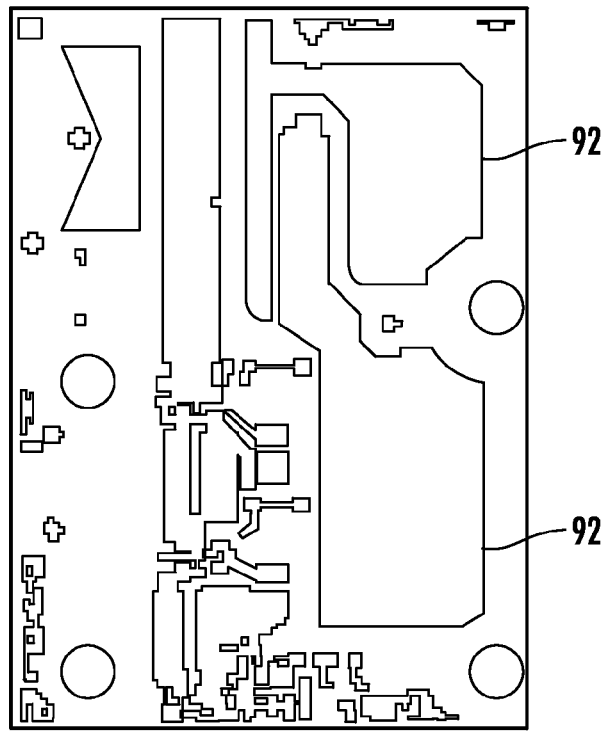
FIG. 9 is another plan view of a PCB construction showing layer 1 art work having large copper areas that are used to spread and transfer heat from a component into and through the PCB.

FIG. 9 shows a layer 1 art work for the PCB and showing large copper areas 92 that are used to spread and transfer heat from an electronic component into and through the PCB. There are multiple layers similar to this in the PCB's and used to increase the conduction through the PCB. FIG. 8A shows the various layers with the conductive vias 93 interconnecting. The vias could be drilled holes with an internal copper coating in one example.

FIG. 10 is a chart showing an example of a MOSFET as a representative electronic component that has a low thermal resistance to the PCB such as on the order of about 0.5 c/w to a solder tab, which is soldered directly to a PCB. Thus, it is possible to choose electronic components with the low internal thermal resistance to the PCB with the integrated circuit packaging and use the PCB construction with the copper, such as the vias and thick planes to transfer heat from the bottom of the component to the circuit side of the PCB and make heat transfer more efficient.

With this type of construction as described, the TIM can be applied to the circuit side of the PCB and attached to the heat sink located on the circuit side of the PCB. Because the TIM and heat sink no longer have to be configured to deal with tolerance stack up of the component and the manufacturing process, the TIM can be thinner than they would otherwise be, and thus, the TIM as an adhesive or prefabricated TIM strips can be used as illustrated. Additionally, the thinner TIM can be made to have a harder/less compliant formulation because the mounting interface tolerance stack up is removed. This also allows direct access to the components for troubleshooting, without having to remove the PCB from the heat sink. This also reduces the possibility of damage to a component that might require the heat sink. This also permits the thermal imaging of the component side of the PCB since the heat sink no longer blocks the view as illustrated in the various drawings of FIGS. 2-7.

Figure 11:
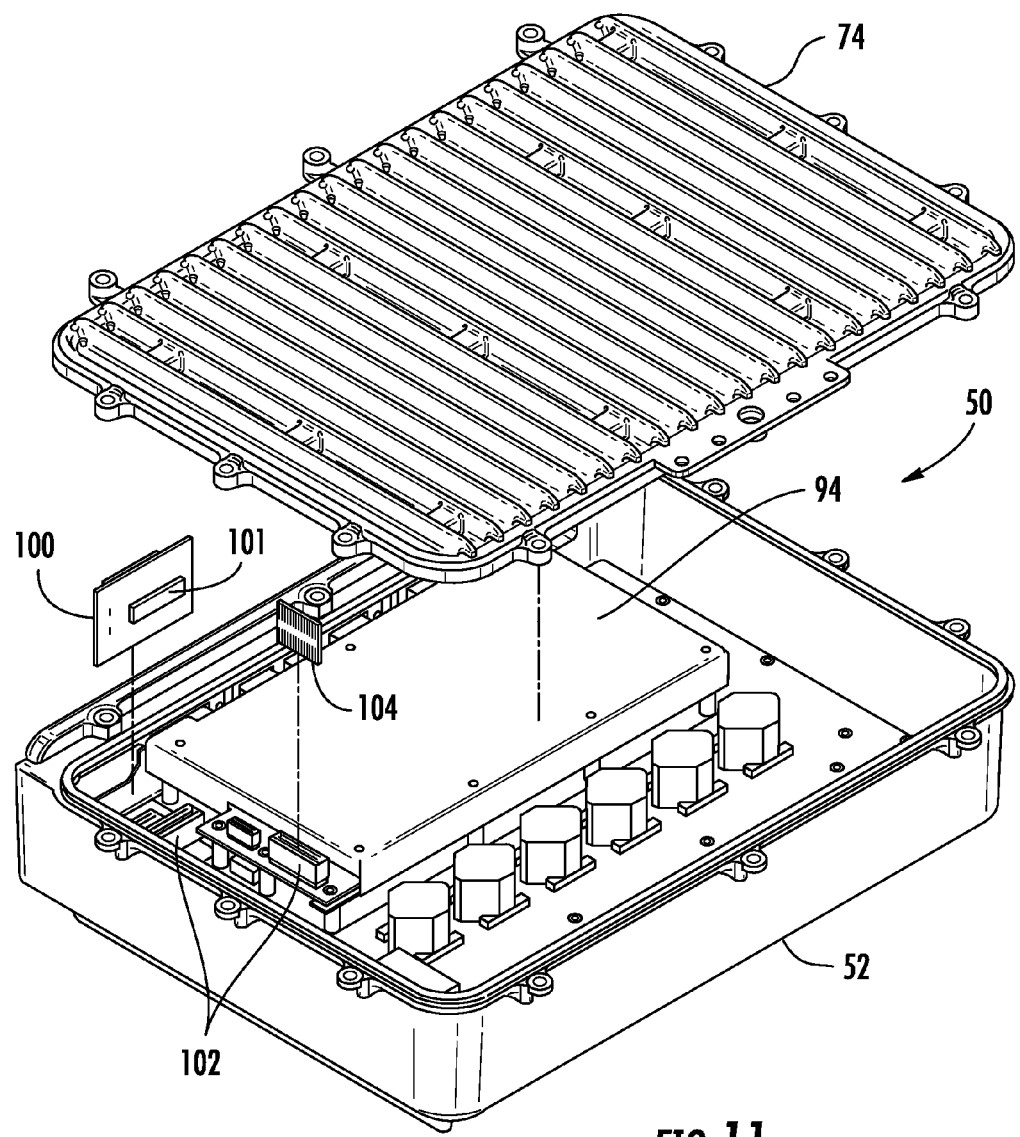
FIG. 11 is an exploded isometric view showing PCB finger connectors that are used to interconnect the component sides of the PCB's as connected to the base unit and cover.
Figure 12:
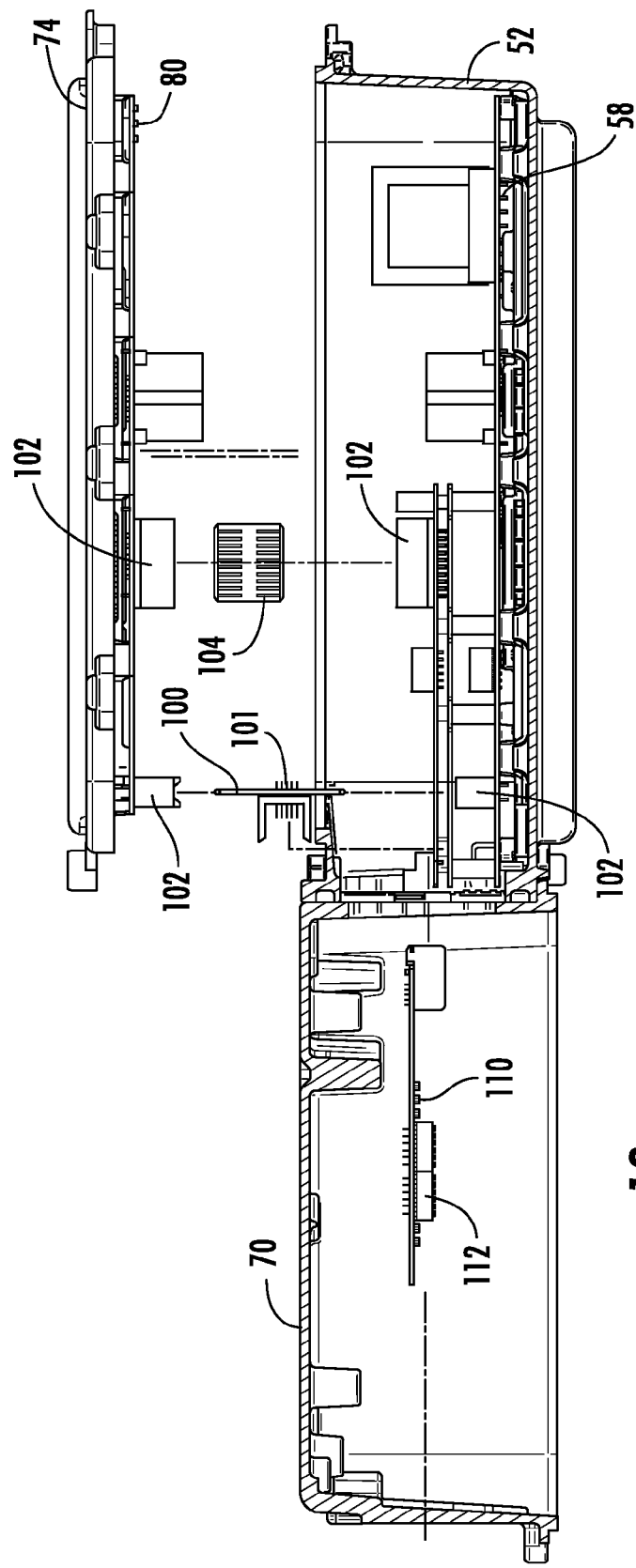
FIG. 12 is an exploded isometric view showing the finger connectors used to connect the PCB's as carried by the cover and base unit.
Figure 13:
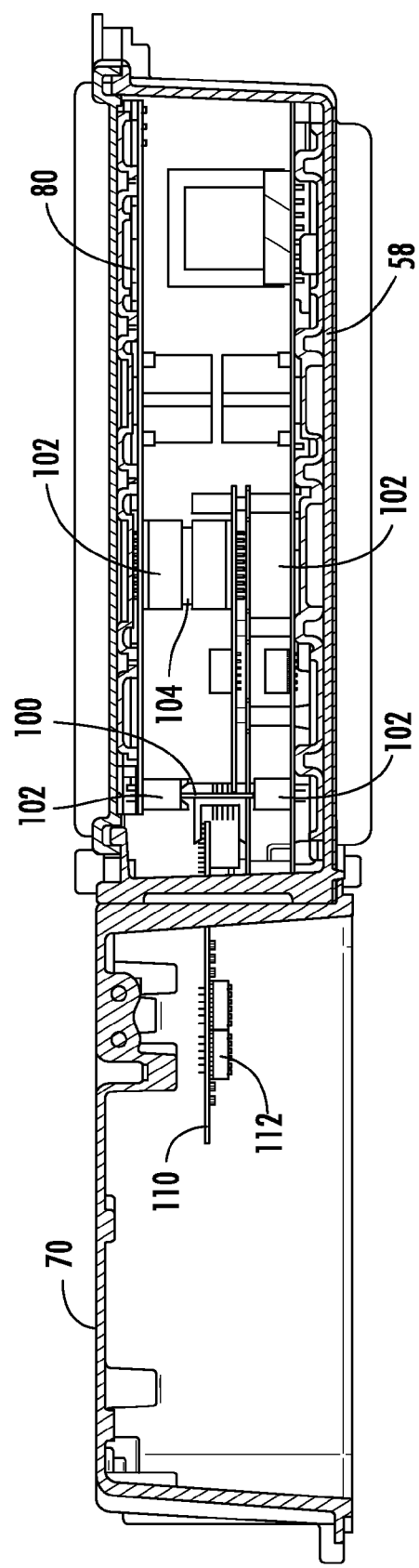
FIG. 13 is a fragmentary sectional view showing the enclosure for outside plant equipment in an assembled format.

The enclosure 50 shown in FIGS. 11-13 illustrates how it is possible to heat sink to the circuit side of the PCB for improved thermal performance and manufacturing and includes the multiple printed circuit boards as described before, and illustrating an improved manner of connecting the multiple printed circuit boards together when the component side of each PCB faces each other.

When there is a PCB 58 attached to a heat sink 54 in the base unit 52 as illustrated and another PCB 80 attached to the heat sink 78 in the cover 74, a technical problem is how to connect those two boards together in a blind, reliable and inexpensive manner. Typically, simple header and socket combinations have been used in the past, but these are inadequate and not robust enough to work for blind-mate applications. Some connectors had required a large footprint in a "fixed height" connector and are expensive. Other techniques have used cable assemblies to connect both halves of a unit together. Cable assemblies are expensive and there is a risk of pinching wires if the cable assembly is not routed correctly when the unit is assembled.

As shown in FIG. 11, a number of the electronic components on the PCB secured in the base unit are covered with an enclosure forming a "can" 94 or container to protect those electronic components such as various integrated circuits. FIG. 12 shows a partial sectional view with the cover removed from the base unit and the base unit and the cover each include the respective PCB attached to the respective heat sink and in which the component side of each PCB are opposed and facing each other when connected.

A technical solution in accordance with a non-limiting example uses a gold-finger PCB connector 100 to interconnect the first and second PCB's at the component side. These PCB connectors 100 are designed as smaller PCB's with various components 101 to aid in making proper electrical connection with impedances between the PCB's. This PCB finger connector 100 interoperates with scoop type connectors 102 on mating PCB's to allow interconnection between the PCB's as illustrated. This scoop type connector 102 forms a socket on the component side of each of the first and second PCB's as illustrated and is configured to receive an edge of the PCB finger connector and to make a blind-mated connection. The use of the PCB connector 100 and in this example as a gold-finger PCB connector allows for infinite different height combinations between mated boards by changing the length of the PCB connector. This PCB connector 100 has in this example fingertop contacts that are typically gold plated, but other metallic platings could be used. By using the scoop-type connectors 102 as a socket on the PCB, this allows for a large range of misalignment between the boards, but still allows a reliable blind-mated connection. The use of the PCB finger connector also allows for a much broader range of height tolerance between mated PCB halves and the base unit and cover due to the construction with the contact between the connector as a socket and the PCB finger connector. The cost of the combination of the PCB finger connector 100 and socket as a scoop-end connector 102 is typically less than a comparable cable assembly with mating connectors. Additionally, there is no concern about the possibility of pinching a wire or degrading a cable assembly because of temperature considerations.

Also, as illustrated in the example of FIGS. 11 and 12, the finger connector is formed as a printed circuit board and includes the electronic components 101 to aid in connecting the PCB's, which include different functions within the OSP equipment as illustrated. Thus, the PCB finger connector itself can have circuit functionality to aid in making a connection between two complicated circuits that could be contained on each PCB. Another PCB finger connector 104 is shown in FIG. 11 and illustrated more as a gold-plated finger connector that includes limited circuit functionality as compared to the other PCB finger connector that includes an electronic component 101 mounted thereon to add functionality to the PCB finger connector.

FIG. 11 shows the exploded isometric view with the cover 74 removed and FIG. 12 shows a sectional view and showing a secondary enclosure 70 attached to the base unit 52. This secondary enclosure includes a PCB 110 having various electronic components 112.

FIG. 13 shows the cover 74 secured onto the base unit 52 and the PCB finger connectors interconnecting the first and second PCB's at the component side.

Figure 14:
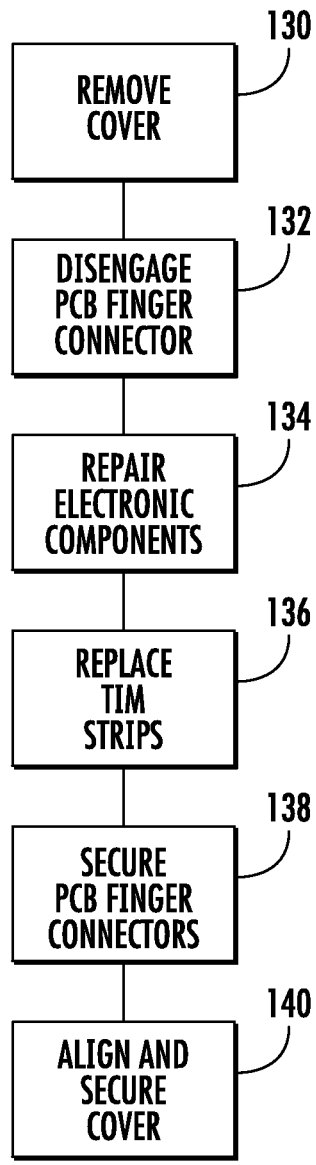
FIG. 14 is a flowchart showing a high-level methodology for repairing outside plant equipment in accordance with a non-limiting example.

FIG. 14 is a high-level flowchart illustrating a method of repairing an enclosure for outside plant equipment. The cover is first removed (block 130) and the PCB finger connector disengaged from the respective sockets on first and second PCB's that are attached to the respective base unit and cover (block 132). Electronic components are repaired (block 134), and if necessary, any TIM strips are replaced if the PCB is actually removed from any respective cover or base unit. The PCB finger connectors (block 138) are secured in respective sockets and the cover is aligned and the PCB finger connectors and sockets aligned and the cover closed over the base unit and secured (block 140).

Figure 15:
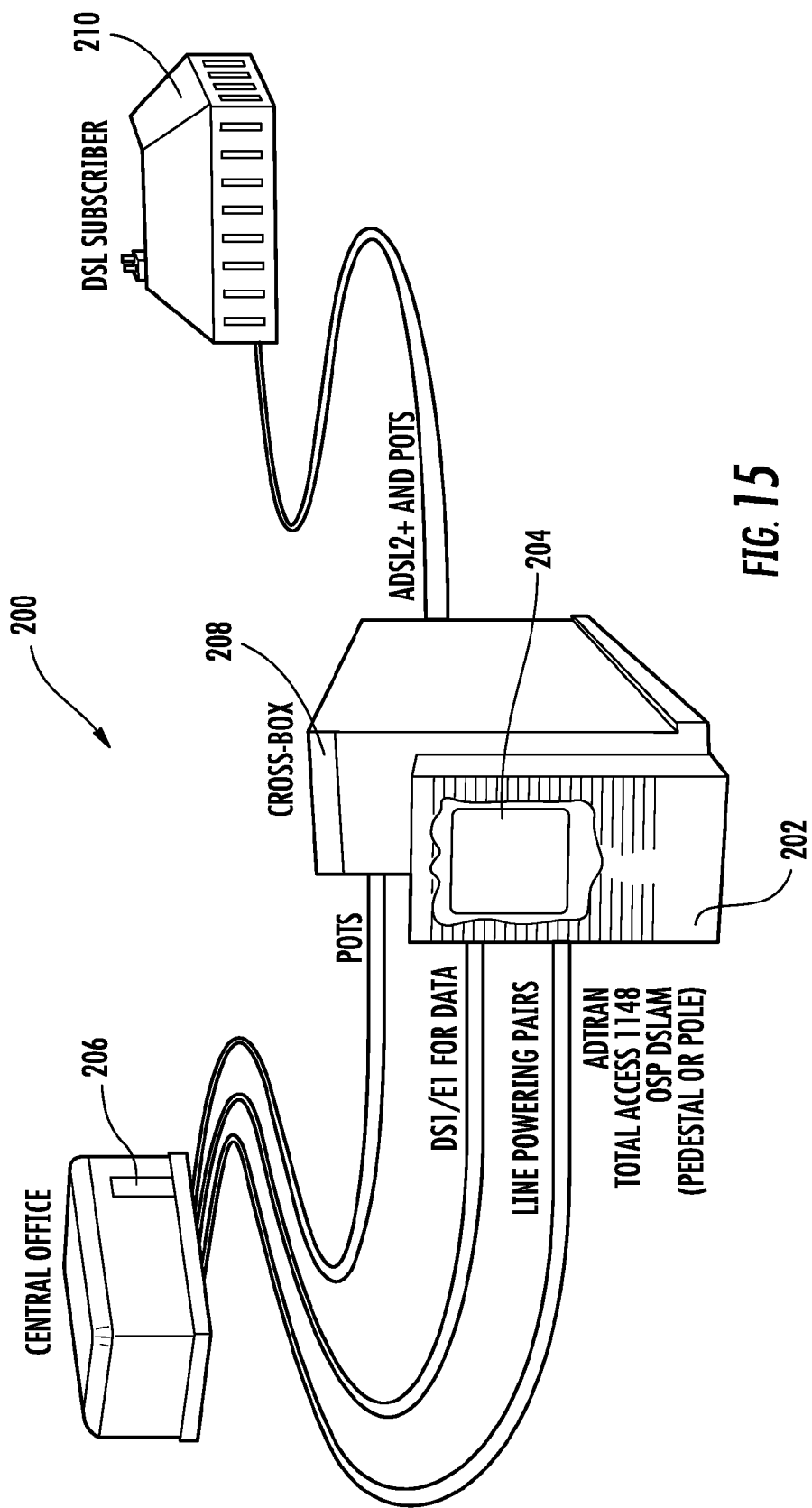
FIG. 15 is a system view of a network configuration showing an OSP DSLAM, central office and DSL subscriber that could incorporate the enclosure for outside plant equipment in accordance with a non-limiting example.

FIG. 15 is an example of a communications system 200 that includes an example enclosure 202 for outside plant equipment 204 showing a central office 206, a cross-box 208 that connects to the OSP equipment 204 such as the OSP DSLAM mounted on a pedestal or pole, for example, a Total Access 1148 as a non-limiting example and as manufactured by ADTRAN, INC. The central office 206 communicates by POTS and DS1/E1 for data and aligns powering pairs while the cross-box and OSP DSLAM connects via an xDSL and POTS to the DSL subscriber 210 as indicated. In this example, the OSP equipment is environmentally hardened and self-contained DSLAM as a Total Access 1100 series of OSP DSLAM's and typically has a 48-port capacity with integrated xDSL and POTS. Line power from the central office can use one to eight powering pairs and requires no AC or battery back up. Line powering can extend up to 60,000 feet in a non-limiting example. Local powering is 48 VDC and 110 VAC options if available. The DS1/E1 network uplinks allow use of existing copper infrastructure in this example. It can be remotely provisioned and managed through TL1, Telnet, SNMP, or total access EMS and save truck dispatch costs. It includes integrated POTS splitters and gigabyte expansion port for easy upgrade to a "triple play" delivery platform. In one example, the units have 5-foot stubs terminated with 710 splice connections for access to ADSL, ADSL2, or ADSL2+ and POTS. Although the unit is shown in FIG. 15 as connected to a cross-box, it can be mounted in any outdoor environment including a pedestal, pole, cross-box, remote terminal and other challenging locations. POTS service is not power dependent. The use of line power from the central office eliminates any requirement for AC or battery back-up power. They may be remotely provisioned using TL1, Telnet, SNMP or an Element Management System (EMS) to enable service providers to operate the unit without a truck dispatch. In one example, the OSP DSLAM described is about 18 inches in height by about 15.5 inches in width by about 3.5 inches in depth and weighs about 20 pounds.

This application is related to copending patent application entitled, "OUTSIDE PLANT (OSP) EQUIPMENT, HEAT SINK DEVICE AND METHOD OF REPAIRING OSP EQUIPMENT," which is filed on the same date and by the same assignee, the disclosure which is hereby incorporated by reference.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. An enclosure for outside plant equipment, comprising:
   a base unit;
   a first printed circuit board (PCB) carried by the base unit and having a circuit side and opposing component side on which electronic components are mounted, and a heat sink connected to the first PCB at the circuit side and configured to dissipate heat from any electronic components mounted on the first PCB at the component side;

a cover attached to the base unit and having an inside surface covering the enclosure;
a second PCB having a circuit side and opposing component side on which electronic components are mounted, said second PCB being supported by the inside surface of the cover, and a heat sink connected to said second circuit board at the circuit side and configured to dissipate heat from any electronic components mounted on the second PCB; and
a PCB finger connector interconnecting the first and second PCB's at the component side.

2. The enclosure according to claim 1, wherein said PCB finger connector comprises a gold-finger PCB connector.

3. The enclosure according to claim 1, and further comprising a socket on the component side of each of the first and second PCB's and configured to receive an edge of the PCB finger connector and to make a blind-mated connection.

4. The enclosure according to claim 1, wherein said heat sink connected to said first PCB is mounted within said base unit and secured thereto and said first PCB is secured at the circuit side to the heat sink.

5. The enclosure according to claim 1, wherein said heat sink connected to said second PCB is mounted to said cover and said second PCB is secured at the circuit side to the heat sink.

6. The enclosure according to claim 1, wherein said PCB further comprises vias and thick plane sections to transfer heat from electronic components mounted on the component side to the circuit side into the heat sink.

7. The enclosure according to claim 1, wherein said PCB comprises a plurality of planar configured metallic layers configured to spread and transfer heat from any electronic components mounted on the component side through the PCB into the heat sink.

8. The enclosure according to claim 1, and further comprising a thermal interface material (TIM) applied to the circuit side of each PCB and secured to the respective heat sink.

9. The enclosure according to claim 8, and further comprising a plurality of TIM strips connected to each heat sink and respective PCB.

10. The enclosure according to claim 9, wherein each heat sink comprises riser sections to which said plurality of TIM strips are connected.

11. The enclosure according to claim 8, wherein said plurality of TIM strips are arranged in substantially parallel rows.

12. The enclosure according to claim 8, wherein each TIM comprises an adhesive material.

13. An enclosure for outside plant equipment, comprising:
a base unit;
a first printed circuit board (PCB) supported by the base unit and having a circuit side and opposing component side on which electronic components are mounted;
a cover attached to the base unit and having an inside surface;
a second PCB having a circuit side and opposing component side on which electronic components are mounted, said second PCB being supported by the cover at the inside surface, wherein said component sides of said first and second PCB's face each other in opposing relation; and
a PCB finger connector interconnecting the first and second PCB's at the component side, the PCB finger connector comprising a PCB and an electrode printed on the PCB, the PCB finger connector configured to be received in a scoop-type connector.

14. The enclosure according to claim 13, wherein said PCB finger connector comprises a gold-finger PCB connector.

15. The enclosure according to claim 13, and further comprising a socket on the component side of each of the first and second PCB's and configured to receive an edge of the PCB finger connector and to make a blind-mated connection.

16. The enclosure according to claim 13, and further comprising a heat sink connected to said first PCB and mounted to said base unit and secured thereto and said first PCB is secured at the circuit side to the heat sink.

17. The enclosure according to claim 16, and further comprising a heat sink connected to said second PCB and mounted to said cover and said second PCB is secured at the circuit side to the respective heat sink.

18. The enclosure according to claim 17, and further comprising a thermal interface material (TIM) applied to the circuit side of each PCB and secured to the respective heat sink.

19. The enclosure according to claim 18, and further comprising a plurality of TIM strips connected to each heat sink and respective PCB.

20. The enclosure according to claim 19, wherein each heat sink comprises riser sections to which said plurality of TIM strips are connected.

21. The enclosure according to claim 19, wherein said plurality of TIM strips are arranged in substantially parallel rows.

22. The enclosure according to claim 18, wherein each TIM comprises an adhesive material.

23. The enclosure according to claim 13, wherein each PCB further comprises vias and thick plane sections to transfer heat from electronic components secured on the component side to the circuit side into a heat sink.

24. The enclosure according to claim 13, wherein each PCB comprises a plurality of planar configured metallic layers configured to spread and transfer heat from any electronic components secured on the component side through the PCB into a heat sink.

25. An enclosure for outside plant equipment, comprising:
a base unit;
a first PCB carried by the base unit and having a circuit side and opposing component side on which electronic components are mounted, and a first heat sink connected to the first PCB at the circuit side and configured to dissipate heat from any electronic components mounted on the first PCB at the component side;
a second PCB having a circuit side and opposing component side on which electronic components are mounted, and a second heat sink connected to said second circuit board and configured to dissipate heat from any electronic components mounted on the second PCB at the component side; and
a PCB finger connector interconnecting the first and second PCB's at the component side.

26. The enclosure according to claim 25, wherein said PCB finger connector comprises a gold-finger PCB connector.

27. The enclosure according to claim 25, and further comprising a socket on the component side of each of the first and second PCB's and configured to receive an edge of the PCB finger connector and to make a blind-mated connection.

28. The enclosure according to claim 25, and further comprising a thermal interface material (TIM) applied to the circuit side of each PCB and secured to the respective heat sink.

29. An enclosure for Outside Plant Equipment, comprising:
- a base unit of the Outside Plant Equipment;
- a cover;
- a first heat sink connected to the base unit;
- a first printed circuit board (PCB) having a circuit side and opposing component side on which components are mounted, said first PCB secured at the circuit side to the first heat sink mounted to the base unit, wherein said first PCB is configured to transfer heat from the bottom of any component on the component side to the circuit side of the first PCB; and
- said cover includes a second heat sink carried by the cover, a second PCB having a circuit side and opposing component side on which components are mounted, said second PCB secured at the circuit side to said second heat sink carried by the cover, wherein electronic components on the component side of either of the PCB's can be readily accessed; and
- a PCB finger connector that interconnects both component sides of the first and second PCB's and securing the cover back onto the base unit.

30. The enclosure according to claim 29, wherein the PCB finger connector comprises a gold-finger PCB connector.

31. The enclosure according to claim 29, wherein the PCB finger connector includes an edge and further comprising a socket on the component side of each of the first and second PCB's to receive an edge and make a blind-mated connection.

32. The enclosure according to claim 29, and further comprising a TIM (Thermal Interface Material) applied to the circuit side of a PCB.

* * * * *